US012713963B2

(12) United States Patent
Komatsu et al.

(10) Patent No.: US 12,713,963 B2
(45) Date of Patent: Aug. 18, 2026

(54) LASING TO ATTACH DIE TO LEAD FRAME

(71) Applicant: TEXAS INSTRUMENTS INCORPORATED, Dallas, TX (US)

(72) Inventors: Daiki Komatsu, Beppu (JP); Kashyap Mohan, Irving, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 916 days.

(21) Appl. No.: 17/977,610

(22) Filed: Oct. 31, 2022

(65) Prior Publication Data

US 2024/0145419 A1 May 2, 2024

(51) Int. Cl.

| | |
|---|---|
| ***H10W 74/10*** | (2026.01) |
| ***H10P 72/00*** | (2026.01) |
| ***H10W 74/01*** | (2026.01) |
| ***H10W 74/15*** | (2026.01) |
| *H10W 72/00* | (2026.01) |
| *H10W 72/20* | (2026.01) |
| *H10W 90/00* | (2026.01) |

(52) U.S. Cl.

CPC ....... *H10W 74/114* (2026.01); *H10P 72/0446* (2026.01); *H10W 74/012* (2026.01); *H10W 74/15* (2026.01); *H10W 72/07141* (2026.01); *H10W 72/072* (2026.01); *H10W 72/07235* (2026.01); *H10W 72/07236* (2026.01); *H10W 72/252* (2026.01); *H10W 90/726* (2026.01)

(58) Field of Classification Search

CPC .............. H10W 74/114; H10W 74/012; H10P 72/0446; H01L 24/16; H01L 21/563; H01L 21/67144

See application file for complete search history.

(56) References Cited

U.S. PATENT DOCUMENTS

| | | | | |
|---|---|---|---|---|
| 2013/0270230 A1* | 10/2013 | Cheung | H01L 24/75 | 228/180.21 |
| 2016/0049381 A1* | 2/2016 | Ryu | H01L 24/81 | 438/125 |
| 2020/0212001 A1* | 7/2020 | Bayless | H01L 24/81 | |
| 2021/0384376 A1* | 12/2021 | Liao | H01L 21/67242 | |
| 2023/0039094 A1* | 2/2023 | Jang | H01L 24/81 | |
| 2024/0006396 A1* | 1/2024 | Lin | H01L 23/5386 | |

* cited by examiner

*Primary Examiner* — Errol V Fernandes

(74) *Attorney, Agent, or Firm* — Ronald O. Neerings; Frank D. Cimino

(57) ABSTRACT

An example method includes placing a semiconductor die on a bonding surface of metal substrate. The die includes metal pillars extending from a surface of the die aligned with respective bonding locations on the bonding surface of the substrate. The pillars and the substrate can be formed of a common type of metal. The method also includes controlling a laser to emit laser light to heat the substrate at respective bonding locations to bond the metal pillars with the substrate at the respective bonding locations.

24 Claims, 5 Drawing Sheets

LASING TO ATTACH DIE TO LEAD FRAME

TECHNICAL FIELD

This description relates generally to lasing to attach die to lead frame.

BACKGROUND

Die attach is an interconnection process by which one or more semiconductor die are placed on a lead frame or other substrate and using epoxy, eutectic, or soft solder to hold the die on the substrate. Flip chip is one particular type of die attach process that involves picking a chip from a wafer or other presentation method, flipping the die over, aligning the die and placing it on the substrate. The interconnects between the die and the substrate typically include balls or pillars that have been formed on the die surface. Existing die attach technologies, particularly flip chip processes, tend to exhibit reduced electromigration performance over the life of the integrated circuit chip. This issue of electromigration tends to increase as the size of the die shrink and device densities on the die increase.

SUMMARY

An example method includes placing a semiconductor die on a bonding surface of metal substrate. The die includes metal pillars extending from a surface of the die aligned with respective bonding locations on the bonding surface of the substrate. The pillars and the substrate can be formed of a common type of metal. The method also includes controlling a laser to emit laser light to heat the substrate at respective bonding locations to bond the metal pillars with the substrate at the respective bonding locations.

Another example described herein includes a semiconductor device. The semiconductor device includes a lead frame having a bonding surface that includes a plurality of bonding locations. A die includes metal pillars extending from a surface of the die, and each of the pillars directly bonded with the bonding surface at respective bonding locations. The pillars and the lead frame can be formed of a common type of metal. A molding compound encapsulates the die, including the metal pillars over the bonding surface.

Another example described herein includes a system. The system includes a pick and place system having a picking head configured to place die on a bonding surface of a lead frame so pillars, which extend from a surface of the die, are aligned with respective bonding locations on the bonding surface of the lead frame. A laser bonding system includes a plurality of lasers and a controller. The lasers are arranged and configured to provide laser light through a window, which is configured as a surface to support the lead frame under the picking head during die placement. The controller is configured to control at least one of the lasers to emit laser light for heating the lead frame to form at least one localized melt region in the lead frame at one or more respective bonding location to bond at least one of the metal pillars directly with the substrate at the at least one respective bonding location.

DETAILED DESCRIPTION

This description relates generally to systems and methods to attach die to lead frames using laser. For example, the die includes metal pillars (e.g., bumps) extending from a surface of the die. The die can include flip chip or other semiconductor die. Assembly equipment is configured to pick and place a die on a bonding surface of metal substrate. The assembly equipment can use optical or other alignment systems to align the pillars with respective bonding locations on the surface of the substrate. To facilitate bonding, the pillars and the substrate can be formed of a common type of metal (e.g., a metal having common thermal and mechanical properties). Once the die is placed at a desired bonding location, a laser system (e.g., having one or more lasers) emits a focused laser to heat the substrate at the respective bonding locations. The substrate is formed of a metal having a high (e.g., greater than 50%) absorption at the wavelength of the laser. The laser system thus provides the laser to form localized melt regions in the substrate at the respective bonding locations responsive to the laser. The placement system can apply pressure to urge the metal pillars into engagement with the respective bonding locations where localized metal pools are being formed. The laser can be deactivated to enable solidification of the melt pools to bond the metal pillars with the substrate at the respective bonding locations.

Because the bond can be formed without solder or other interface between the substrate and substrate, the resulting semiconductor device can exhibit improved electromigration compared to packaged semiconductor devices assembled using other approaches. Additionally, because the laser can be focused to form localized melt regions, without solder reflow and potential overflow, the distance between adjacent pillars can be reduced compared to many existing approaches.

Figure 1:
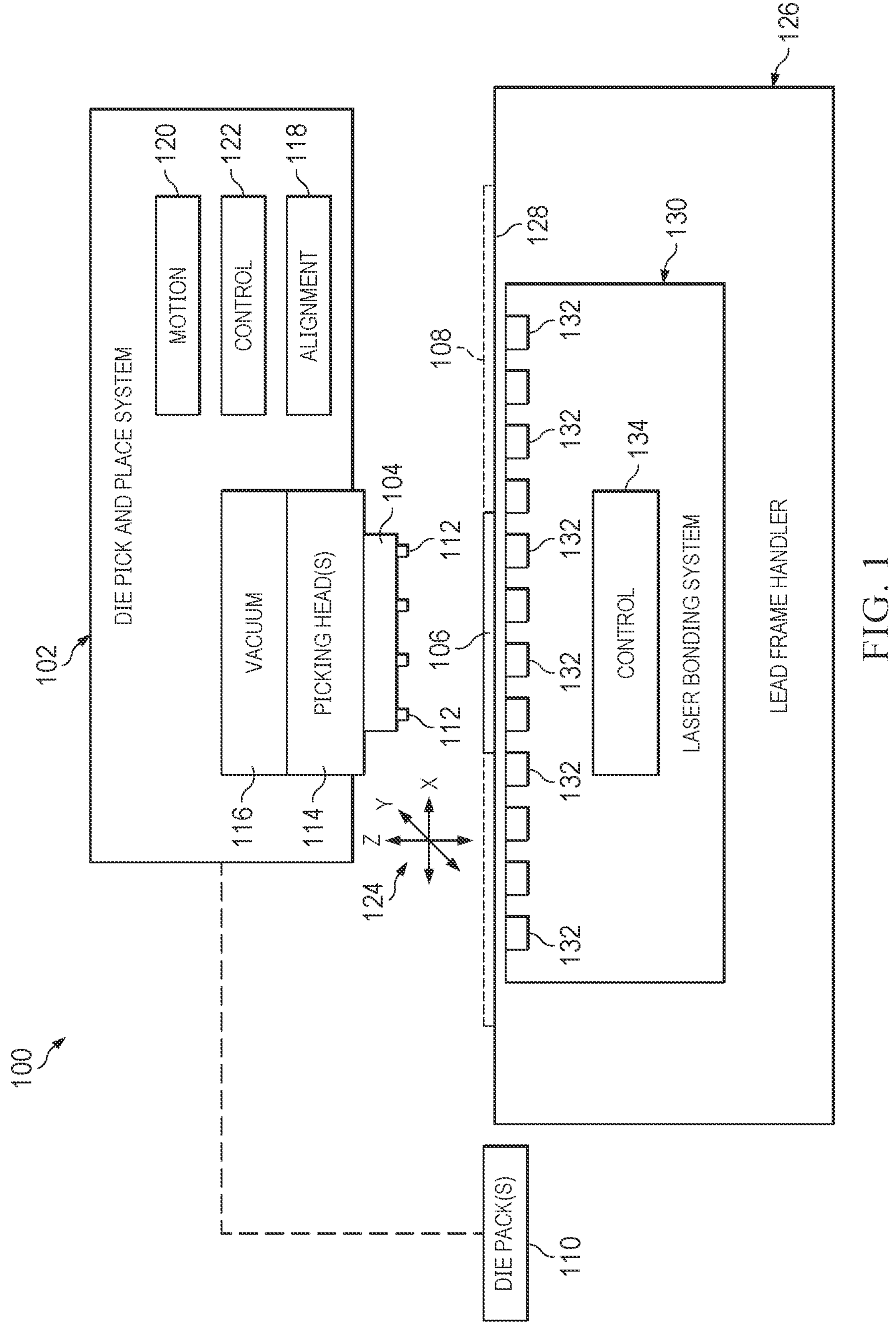
FIG. 1 is a schematic block diagram showing an example of a die attach system.

FIG. 1 is a schematic block diagram showing an example of a die attach system 100. The system 100 includes an arrangement of equipment configured to assemble semiconductor devices as part of a back end semiconductor fabrication process. The system 100 includes a die pick and place system 102 configured to pick up and place one or more die 104 onto an electrically conductive substrate 106. The substrate 106 can be a lead frame having one or more package units adapted for assembling respective die. In the following description, unless stated otherwise, the terms substrate and lead frame are used interchangeably. In an example, the substrate 106 can be one of a plurality (e.g., tens, hundreds or thousands) of lead frames distributed across a sheet 108. The sheet 108 can be a thin (e.g., having a thickness of less than 1 mm) sheet of an electrically conductive material, such as a metal (e.g., copper, aluminum or gold). The sheet 108 can be patterned to form respective lead frames 106 interconnected across the sheet by respective tie bars. The lead frames can be arranged across the sheet 108 in a one- or two-dimensional array of lead frames. In some examples, layer of corrosion resistant material (e.g., palladium-nickel or other coating) is applied to opposing surfaces of the sheet of lead frames 106 such as to prevent oxidation.

Each lead frame 106 includes an arrangement of bonding locations for attachment to a respective die 104. The bonding locations can be leads or bond fingers, which are adapted to be couple to respective traces or wires for coupling to terminals (e.g., power supply or other terminals) of associated circuitry. The number and position of bonding locations for a given lead frame 106 is designed to match the arrangement and configuration of pillars (e.g., bumps) 112 for the die 104 being attached.

As a further example, a plurality of the die 104 can be presented to the pick and place system 102 in one or more die packs 110, such as a waffle pack, waffle tray, tape frame or the like. Each of die 104 in the die pack can include an arrangement of the pillars 112 that extend orthogonally from a given surface the respective die. For example, the pillars 112 are formed of an electrically conductive material, such as a metal (e.g., copper, aluminum or gold), which can be the same material as the substrate 106 to which the die 104 is being attached. The die 104 in the die pack 110 can be oriented face-up or face-down.

The pick and place system 102 includes one or more picking heads 114 configured to automatically align and pick up a selected die 104 from the die pack 110. When the bumps are presented face up, the pick and place system 102 can use an inverter to reorient the die 104 so the pillars 112 extend from the die in a direction toward the lead frame 106, such as shown in FIG. 1. The picking head 114 can be coupled to a vacuum 116 for holding the die 104 during placement operations. The pick and place system 102 can also include an alignment tool 118, such as an optical (e.g., camera-based) or other system to locate die, substrate and other positioning indicating features to enable accurate picking and placement functions. The alignment tool 118 can be configured to provide alignment information that describes the position and/or orientation of die 14 and lead frame relative to the pick and place system 102, including respective positions of the pillars 112 and bonding locations of the lead frame 106.

The pick and place system 102 can also include a motion system (e.g., an arrangement of motors and/or actuators) 120 configured to move the picking head 114 in 3 or more degrees of freedom, such as at least along x, y and z axes (shown at 124). An associated control system 122 (e.g., a programmable controller) can be configured to control the motion system 120 to move the picking head 114, such as based on alignment information provided by the alignment tool 118. The control system 122 can also be configured to control application of the vacuum 116 to the picking head 114. Thus, the control system 122 can provide instructions to the picking head 114, vacuum 116 and motion system 120 to control picking and placing operations including positioning and movement of the picking head 114 relative to the die in the die pack 110 and the lead frame.

In the example of FIG. 1, a lead frame handler 126 has a surface 128 configured to support a surface of the lead frame 106 as well as (in some examples) the sheet 108, which is opposite the surface being bonded to the die 104. The surface 128 of the handler 124 can be stationary or movable relative to the pick and place system 102. In some examples, the handler 124 can be configured to adjust a position of the lead frame 106 and/or sheet 108 across the surface 128. As described herein, the pick and place system 102 and/or handler 126 can be configured to align the pillars 112 with respective bonding locations on the lead frame and to place the die 104 on the exposed bonding surface of the lead frame so the pillars contact respective bonding locations during die attach.

For example, prior to die placement for bonding to the lead frame 106, the distal ends of the pillars 112 the die 104 are planarized (e.g., by grinding or etching) a distal end of the respective pillars. The planarizing of the pillars 112 can be performed prior to packaging of die in the die packs 110. Alternatively, the planarizing of the pillars 112 can be performed (e.g., by a mechanical or chemical grinder implemented as part of the system 100 prior to the pick and place system 102 placing the die 104 on the lead frame 106. The planarized distal ends of the pillars 112 provide a smooth surface adapted to contact the prepared surface of the lead frame to facilitate bonding.

The system 100 also includes a laser bonding system 130. The laser bonding system 130 includes one or more lasers 132 and a controller 134. The lasers 132 are arranged and configured to perform laser bonding by sending one or more beams of laser light to heat the lead frame 106 at one or more respective bonding locations thereof. For example, the surface 128 of the handler 126, which supports the substrate, can be a transparent or translucent window (e.g., a glass or crystalline sheet) that enables the laser light from the lasers 132 to pass through with little or no losses in energy. The lasers 132 thus can provide respective laser beams with a wavelength at which conductive material of the substrate has a propensity to absorb. For example, the substrate is formed of a material having an absorption for the laser wavelength of greater than 50%. In one example, the pillars 112 and the lead frame 106 are both formed of copper or a copper alloy, and the laser is a blue laser configured to provide laser light having a wavelength ranging from 400 nm to 500 nm. Other wavelengths can be used depending on the materials of the pillars 112 and the lead frame 106 being bonded. The laser light can be focused (e.g., by optics not shown) to a location within a thickness of the lead frame and with power to form melt regions for bonding the pillars directly with the substrate at the respective bonding locations. The power, laser irradiation time and focal depth for the laser light can be adapted depending on the thickness and material properties of the lead frame.

Also, during the laser bonding, the pick and place system 102 and or handling system can move the die and/or lead frame in the z-direction (e.g., orthogonal to the surface 128) to apply pressure between one or more pillars 112 and heated bonding locations of the lead frame 106 to facilitate bonding between the pillars 112 and the lead frame 106. The laser bonding system 130 can be configured to emit the laser light focused at a single bonding location to bond a respective pillar 112 with the single bonding location. Alternatively, laser bonding system 130 can be configured to emit the laser light focused at multiple bonding locations concurrently (e.g., from two up to all the bonding locations) to bond the pillars 112 with respective bonding location of the lead frame 106. The bonding between the pillars 112 and the lead frame 106 can be diffusion bonding in which the atoms of the pillar(s) and substrate intersperse between each other.

In an example, the lasers 132 are implemented as an array of independently controllable lasers arranged along the surface 128 of the bonding system 130. The lasers 132 can be spaced at positions in the array to enable laser light be to be directed onto a user-configurable number of one or more bonding locations adaptable to various die configurations. The lasers 132 can be implemented as nearly any type of laser provided it can generate sufficient heating of the substrate for bonding with the pillars 112. For example, the lasers 132 can be implemented as gas lasers, chemical lasers, solid state lasers, fiber lasers, photonic crystal lasers or semiconductor lasers (e.g., laser diodes, such as one or more diode bars). In one example, the lasers 132 are implemented as respective vertical cavity surface-emitting lasers (VCSELs), such as each laser including a two-dimensional array of several VCSELs on a common semiconductor chip. As an example, the lasers 132 are configured as blue lasers as shown in the following table.

| | |
|---|---|
| Laser source | Blue laser |
| Wave length | 440 nm to 450 nm |
| Spot diameter | 80-100 um |
| Metal absorption | Au, Cu: High 60% |
| Machining mode | Heating |

Figure 2:
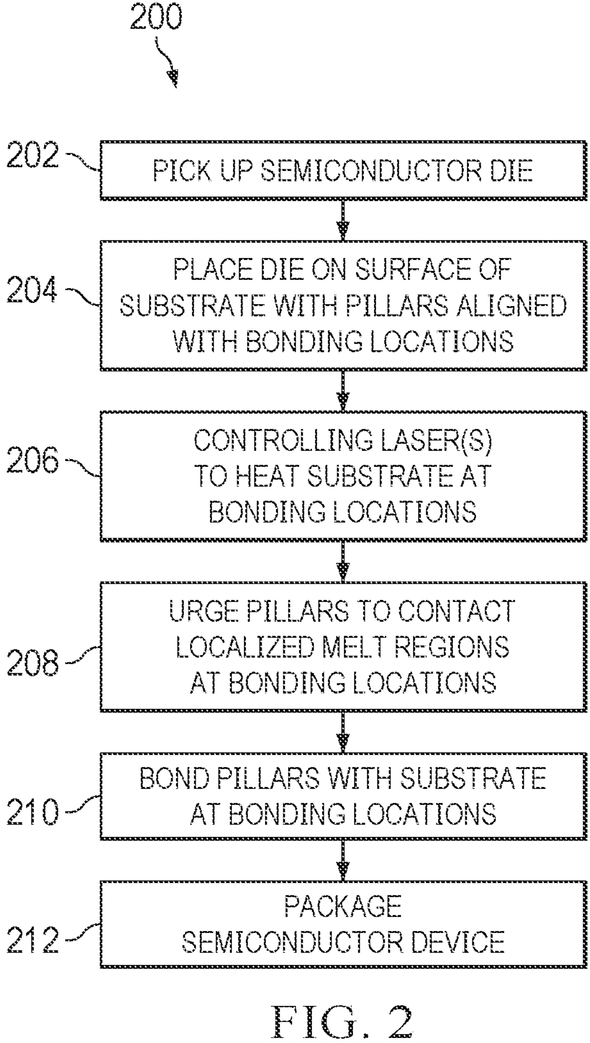
FIG. 2 is a flow diagram showing an example method of back-end processing, including die attach, to form a semiconductor device.

An example method 200 for forming one or more semiconductor devices is illustrated in FIG. 2. While the actions described in the method 200 are presented in the illustrated order, the disclosure contemplates implementing the described actions in different orders consistent with the constraints of semiconductor device manufacturing. FIGS. 3-8 show cross-sectional views of the example device at various stages of the method 200. The method 200 can be implemented using the system of FIG. 1. Accordingly, the description of FIGS. 2-8 also refers to FIG. 1.

Figure 3:
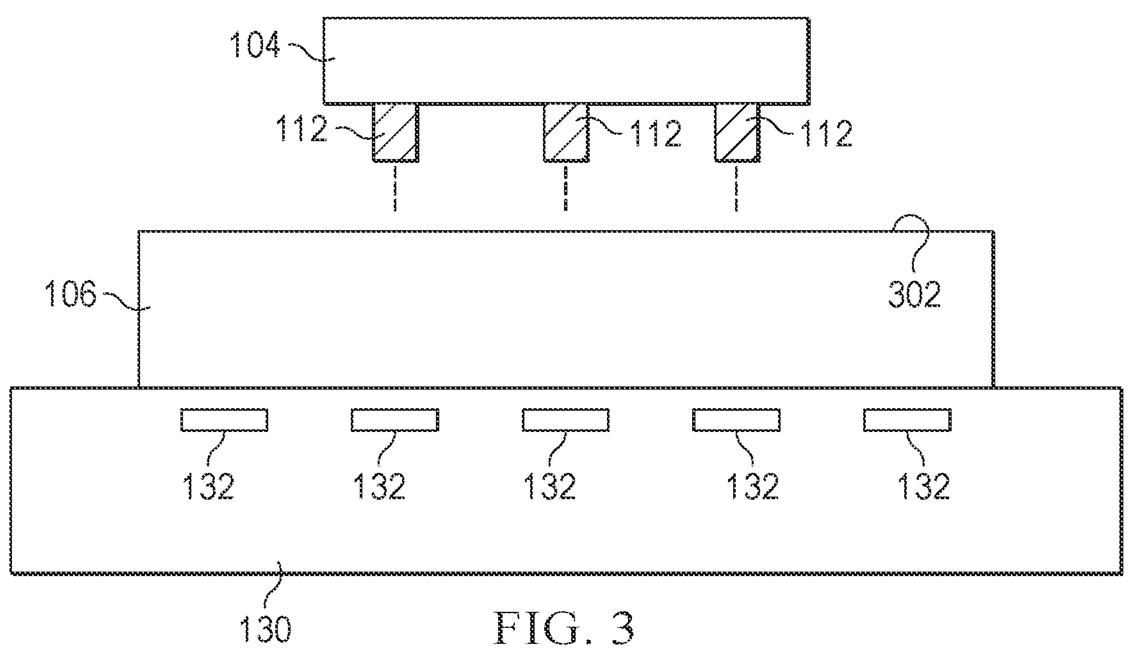
FIGS. 3-8 are cross-sectional diagrams showing various parts of the method of FIG. 2.
Figure 4:
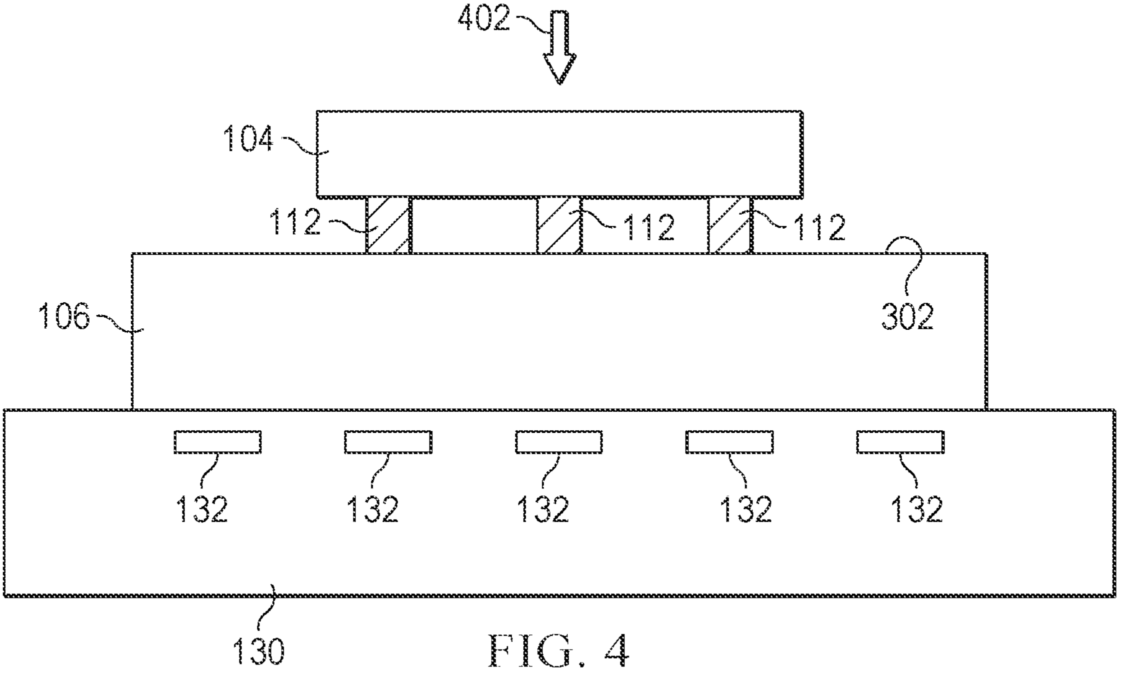

The method 200 begins at 202 in which a semiconductor die is picked up. For example, a pick and place system 102 picks up the die 104 (e.g., a flip chip die). The picking up can include inverting the die so that the pillars extend away from the pick-up head. As shown in FIG. 3, the die 104 includes metal pillars 112 extending from a surface of the die toward a lead frame 106 aligned axially with respective bonding locations on a bonding surface 302 of the lead frame. The pillars 112 and the lead frame can be formed of a common type of metal (e.g., copper). At 204, the die is placed on the surface of the substrate with the pillars aligned with respective bonding locations. For example, as shown in FIG. 4, the die 104 is urged (e.g., by pick and place system 102) in the direction of arrow 402 so the pillars 112 contact respective bonding locations at the bonding surface 302. Optical and/or other alignment tools can provide positioning information used (e.g., by pick and place system 102) to control the placement at 204. As described herein, the pillars can be planarized (e.g., by mechanical grinder or etching) prior to die attach.

Figure 5:
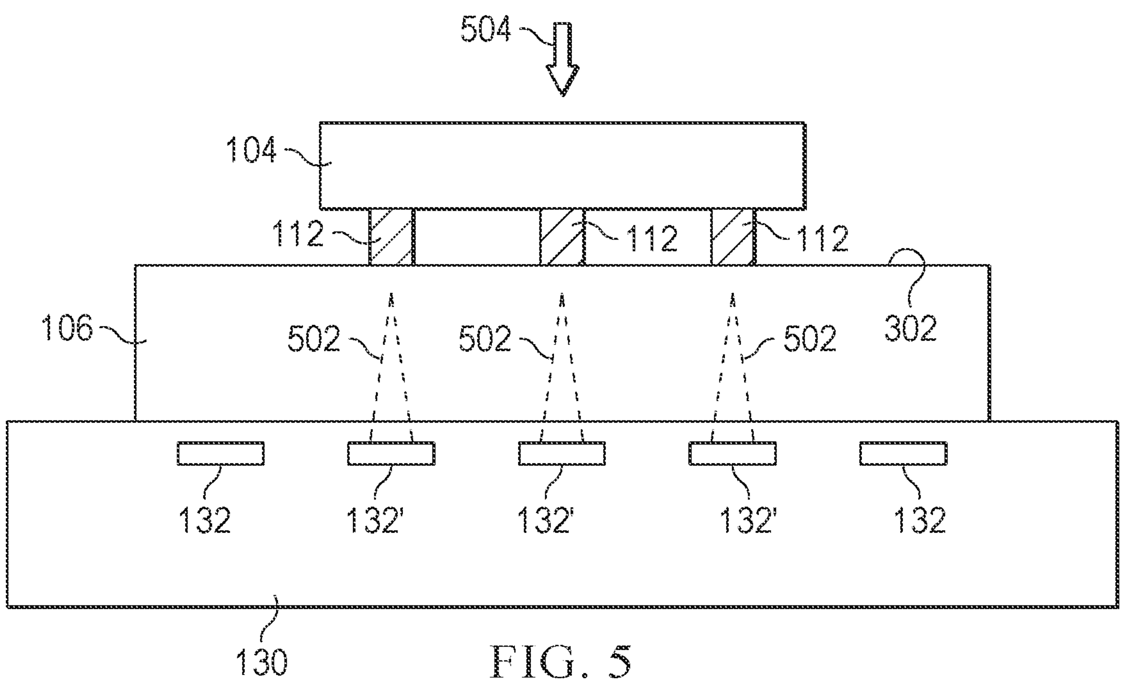

At 206, the method 200 includes controlling one or more lasers to emit laser light to heat the substrate at respective bonding locations. For example, as shown in FIG. 5, a subset of the lasers 132', which are aligned with bonding locations, are controlled (e.g., by controller 134) to send the laser light 502 to one or more bonding locations. While the cross-sectional view shows a row of lasers aligned with the pillars 112, the laser bonding tool can include a two-dimensional array having lasers arranged to provide alignment with each of the bonding locations across the surface of the lead frame. In other examples, pillars 112 can be laser bonded to the substrate 106 sequentially by moving the lasers relative to the substrate and performing laser bonding at each one or more bonding location in the sequence. The laser light 502 can be focused at an intermediate location within the substrate spaced from the surface where the incident light is applied, which can be the surface of the substrate opposite to the bonding surface.

In an example, the controlling at 206 includes controlling the lasers 132' to emit the laser light as a pulsed laser light at a pulse rate and energy to form the localized melt regions 602. The controlling at 206 can also include controlling one or more other laser parameters, including average power, wavelength, peak power, pulse width and/or spot size. In an example where the substrate is copper or a copper alloy, the laser light can be blue laser light having a wavelength ranging from 400 nm to 500 nm. Other wavelengths of laser light can be used to provide an absorption for such wavelength of greater than 50%, which can depend on the material used for the pillars and the substrate.

Figure 6:
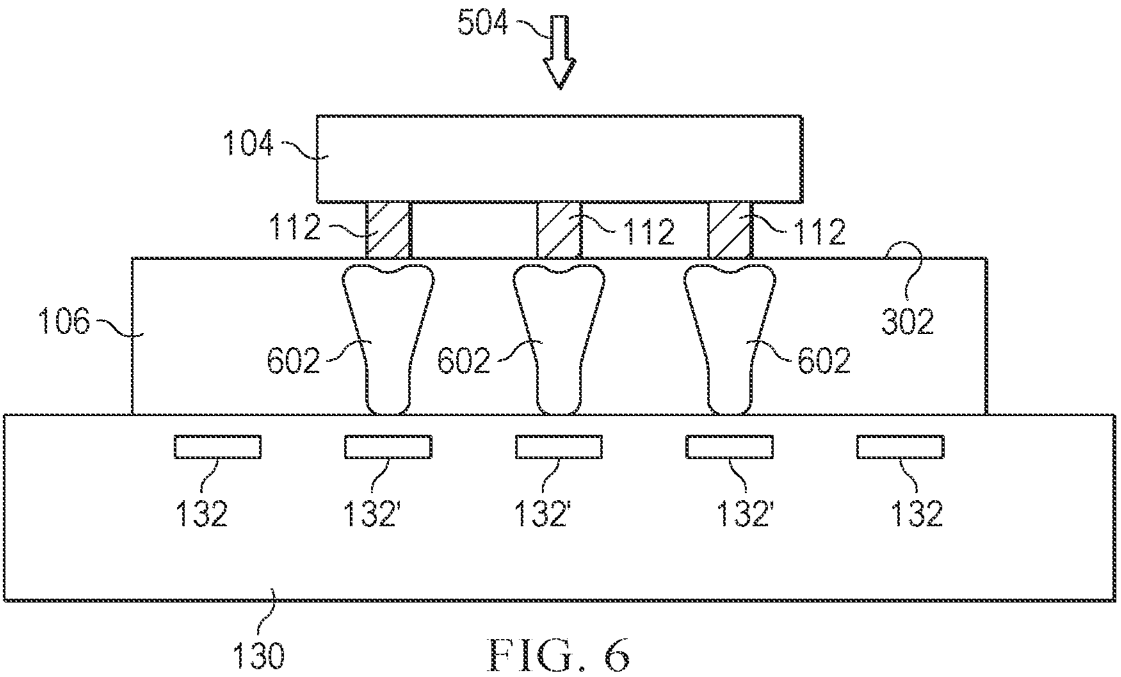

At 208, the pillars are urged to contact the bonding locations during the lasing at 206. For example, as shown in FIG. 5, the pillars 112 can be moved in the direction of arrow 504 (e.g., by pick and place system 102) to exert pressure (e.g., compressive force) between the pillars 112 and the surface 302 at the respective bonding locations. FIG. 6 shows an example during the bonding process where localized melt regions 602 are formed in the substrate at the respective bonding locations responsive to the lasing (at 206).

Figure 7:
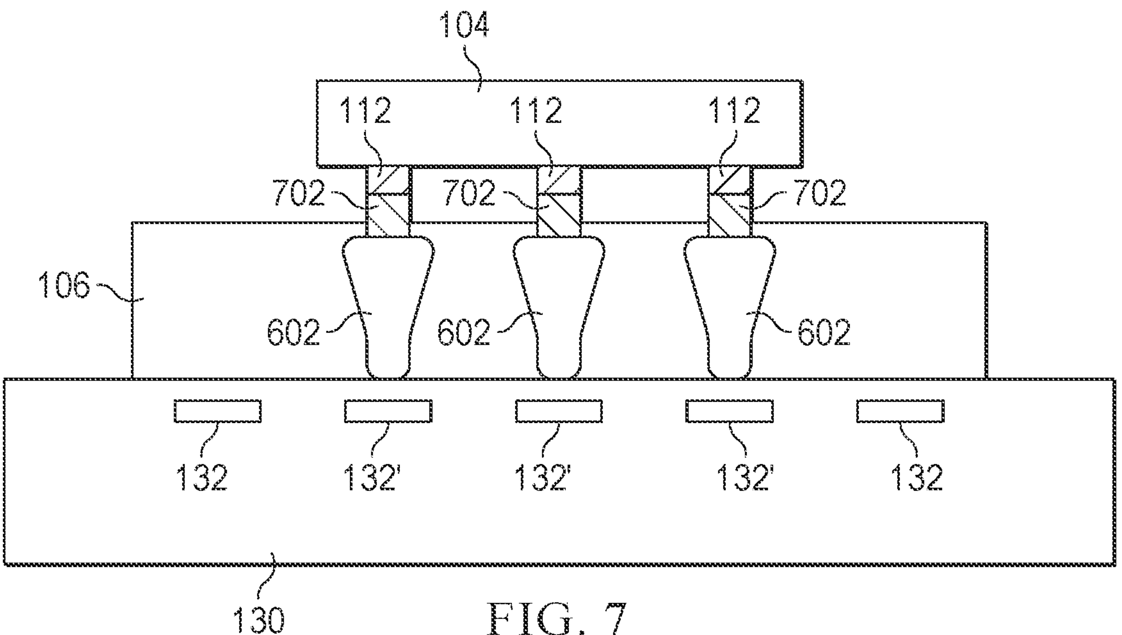

At 210, the pillars are bonded with the substrate at bonding locations. For example, as shown in FIG. 7, bonding 702 occurs between the pillars 112 and the substrate at respective bonding locations responsive to laser-induced heating of the substrate and pressure being applied. The bonding can be diffusion bonding in which the atoms of the materials (e.g., copper or other metal) of the pillars and substrate intersperse amongst themselves during the method.

Figure 8:
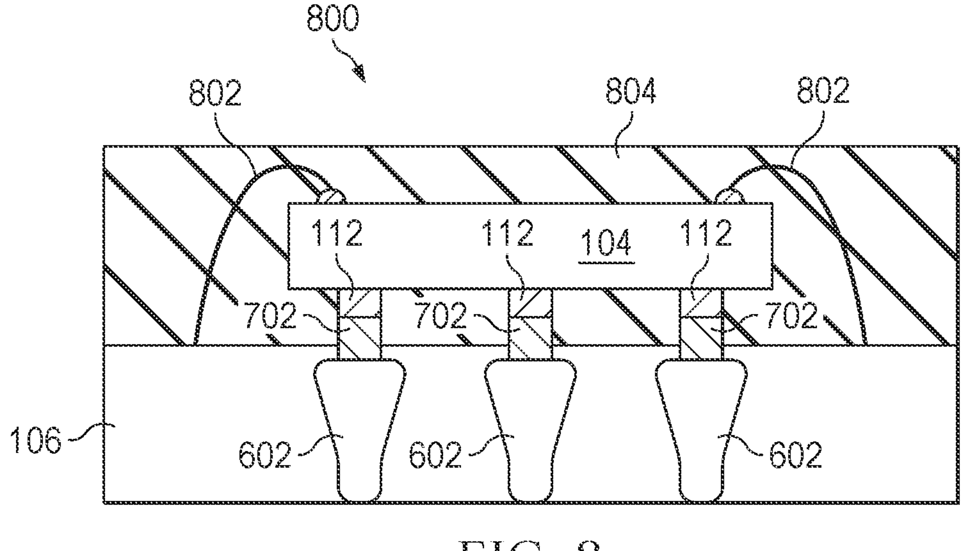

At 212 the method includes completing back-end processing. As shown in FIG. 8, back-end processing can be performed as part of the packaging at 212 to form a semiconductor device 800. For example, the processing at 212 can include wire bonding, in which bondwires 802 are coupled between terminals of the die and the lead frame. After the wire bonding and any addition back-end processing of the die and lead frame is implemented, the device can be encapsulated in an insulating packaging material 804 (e.g., epoxy or other material) to form the semiconductor device 800.

The laser bonding described herein can be implemented to directly bond (e.g., weld by diffusion bonding) the pillars of the die with a lead frame without using solder or another interface material. The intrinsic current carrying capability of copper is superior to solder and thus can prevent solder void and exhibit improved electromigration performance. The direct bonding can also achieve higher thermal conductivity than many existing bonding technologies. The direct laser bonding described herein can also be integrated into existing process flows.

In this description, the term “couple” or “couples” means either an indirect or direct connection. Thus, if a first device couples to a second device, that connection may be through a direct connection or through an indirect connection via other devices and connections. For example, if device A generates a signal to control device B to perform an action, then: (a) in a first example, device A is coupled to device B; or (b) in a second example, device A is coupled to device B through intervening component C if intervening component C does not alter the functional relationship between device A and device B, so device B is controlled by device A via the control signal generated by device A.

Also, in this description, a device that is “configured to” perform a task or function may be configured (e.g., programmed and/or hardwired) at a time of manufacturing by a manufacturer to perform the function and/or may be configurable (or reconfigurable) by a user after manufacturing to perform the function and/or other additional or alternative functions. The configuring may be through firmware and/or software programming of the device, through a construction and/or layout of hardware components and interconnections of the device, or a combination thereof. Furthermore, a circuit or device described herein as including certain components may instead be configured to couple to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor wafer and/or integrated circuit (IC) package) and may be configured to couple to at least some of the passive elements and/or the sources to form the described structure, either at a time of manufacture or after a time of manufacture, such as by an end user and/or a third party.

The recitation "based on" means "based at least in part on." Therefore, if X is based on Y, X may be a function of Y and any number of other factors.

Modifications are possible in the described embodiments, and other embodiments are possible, within the scope of the claims.

What is claimed is:

1. A method comprising:

placing a semiconductor die on a bonding surface of metal substrate, the die including metal pillars extending from a surface of the die aligned with respective bonding locations on the bonding surface of the substrate, the metal pillars and the substrate being formed of a common type of metal; and controlling a laser to emit laser light to heat the substrate at respective bonding locations to bond the metal pillars with the substrate at the respective bonding locations without solder or other interface material.

2. The method of claim 1, further comprising: forming localized melt regions in the substrate at the respective bonding locations responsive to the laser.

3. The method of claim 2, wherein the placing further comprises applying pressure to urge the metal pillars into engagement with the respective bonding locations where localized metal pools are formed for bonding the metal pillars directly with the substrate at the respective bonding locations.

4. The method of claim 3, wherein:

the substrate comprises a lead frame, and the bond between the lead frame and the metal pillars is without solder or other interface.

5. The method of claim 2, wherein controlling the laser comprises controlling laser parameters of the laser light that include at least two of average power, wavelength, peak power, pulse width and spot size.

6. The method of claim 5, wherein the common type of metal has an absorption for the wavelength of greater than 50%.

7. The method of claim 6, wherein the common type of metal is copper or a copper alloy, and the laser is a blue laser configured to provide the laser light having a wavelength ranging from 400 nm to 500 nm.

8. The method of claim 2, wherein the die includes a flip chip interconnect that includes the metal pillars.

9. The method of claim 2, wherein the laser includes an array of independently controllable laser diodes arranged along a surface of a bonding tool, the surface of the bonding tool configured to support a second surface of the substrate, which is opposite the bonding surface, during the placing and the controlling.

10. The method of claim 2, wherein the laser is emitted onto a second surface of the substrate, which is opposite the bonding surface, at locations aligned with the respective bonding locations.

11. The method of claim 2, wherein prior to die placement, the method comprises planarizing a distal end of the respective pillars.

12. The method of claim 2, further comprising encapsulating the die in a molding compound to provide a packaged semiconductor device.

13. A method comprising:

placing a semiconductor die on a bonding surface of metal substrate, the die including metal pillars extending from a surface of the die aligned with respective bonding locations on the bonding surface of the substrate, the metal pillars and the substrate being formed of a common type of metal; and controlling a laser to emit laser light to heat the substrate at respective bonding locations to form localized melt regions in the substrate at the respective bonding locations to bond the metal pillars with the substrate at the respective bonding locations.

14. The method of claim 13, wherein the placing further comprises applying pressure to urge the metal pillars into engagement with the respective bonding locations where localized metal pools are formed for bonding the metal pillars directly with the substrate at the respective bonding locations.

15. The method of claim 14, wherein:

the substrate comprises a lead frame, and the bond between the lead frame and the metal pillars is without solder or other interface.

16. The method of claim 13, wherein controlling the laser comprises controlling laser parameters of the laser light that include at least two of average power, wavelength, peak power, pulse width and spot size.

17. The method of claim 16, wherein the common type of metal has an absorption for the wavelength of greater than 50%.

18. The method of claim 17, wherein the common type of metal is copper or a copper alloy, and the laser is a blue laser configured to provide the laser light having a wavelength ranging from 400 nm to 500 nm.

19. The method of claim 13, wherein the die includes a flip chip interconnect that includes the metal pillars.

20. The method of claim 13, wherein the laser is emitted onto a second surface of the substrate, which is opposite the bonding surface, at locations aligned with the respective bonding locations.

21. The method of claim 13, wherein prior to die placement, the method comprises planarizing a distal end of the respective pillars.

22. The method of claim 13, further comprising encapsulating the die in a molding compound to provide a packaged semiconductor device.

23. A method comprising:

placing a semiconductor die on a bonding surface of metal substrate, the die including metal pillars extending from a surface of the die aligned with respective bonding locations on the bonding surface of the substrate, the metal pillars and the substrate being formed of a common type of metal; and controlling a laser to emit laser light to heat the substrate at respective bonding locations to bond the metal pillars with the substrate at the respective bonding locations, wherein the laser includes an array of independently controllable laser diodes arranged along a surface of a bonding tool, the surface of the bonding tool configured to support a second surface of the substrate, which is opposite the bonding surface, during the placing and the controlling.

24. A method comprising:

placing a semiconductor die on a bonding surface of metal substrate, the die including metal pillars extending from a surface of the die aligned with respective bonding locations on the bonding surface of the substrate, the metal pillars and the substrate being formed of a common type of metal; and heating the substrate at respective bonding locations to bond the metal pillars with the substrate at the respective bonding locations without solder or other interface material.

* * * * *